United States Patent [19]

Takeshita

[11] Patent Number: 4,518,978
[45] Date of Patent: May 21, 1985

[54] SOLID STATE IMAGE SENSOR

[75] Inventor: Kaneyoshi Takeshita, Tokyo, Japan

[73] Assignee: Sony Corporation, Tokyo, Japan

[21] Appl. No.: 399,894

[22] Filed: Jul. 19, 1982

[30] Foreign Application Priority Data

Jul. 20, 1981 [JP] Japan .............................. 56-113382

[51] Int. Cl.³ ..................... H01L 29/78; H01L 27/14; H01L 31/00
[52] U.S. Cl. ......................................... 357/24; 357/30
[58] Field of Search ............................ 357/24 LR, 30

[56] References Cited

U.S. PATENT DOCUMENTS 4,117,514  9/1978  Terui et al. ........................... 357/30

Primary Examiner—Gene M. Munson
Attorney, Agent, or Firm—Hill, Van Santen, Steadman & Simpson

[57] ABSTRACT

A solid state image sensor of the interline transfer type comprises a sensing and vertical transfer portion, a horizontal charge transfer portion and an output portion, having a large number of sensing element regions, each of which contains a photo-sensing area, a vertical charge transfer portion and a channel stopper area with substantially the same impurity concentration provided in areas surrounding the photo-sensing area and forming a transfer gate area are provided in the sensing and vertical transfer portions, and the arrangement of first and second transfer electrodes are provided for the sensing element regions such that the second transfer electrode is located completely on the first transfer electrode in the area of a part of the channel stopper region between two adjacent photo-sensing areas so that it is shielded from a part of the channel stopper region by the first transfer electrode so that the charge transfer efficiency in the vertical charge transfer portion is substantially improved.

3 Claims, 5 Drawing Figures

SOLID STATE IMAGE SENSOR

BACKGROUND OF THE INVENTION

1. Field of the Invention

This invention relates generally to solid state image sensors comprising a charge transfer device, and more particularly to such solid state image sensors of the interline transfer type which are improved in structure so that the charge transfer efficiency in the vertical charge transfer portion is increased.

2. Description of the Prior Art

Solid state image sensors comprising a charge transfer device such as a charge coupled device (hereinafter referred to as a CCD) are classified broadly rnto the frame transfer type and the interline transfer type, and each of these is utilized in different ways so as to make good use of its advantages and features. The solid state image sensor of the interline transfer type using a CCD (hereinafter referred to as an interline transfer CCD image sensor) comprises a sensing and vertical transfer portion including a plurality of photo-sensing areas provided to make horizontal rows and vertical rows, vertical charge transfer portions formed with a group of CCD and provided along each of the vertical rows of the photo-sensing areas and transfer gate areas provided between each of the photo-sensing areas and the corresponding one of the vertical charge transfer portions. A horizontal charge transfer portion is formed for a different group of the CCDs and is coupled to the photo-sensing and vertical transfer portion and an output portion is coupled to the horizontal charge transfer portion and is provided with a signal output terminal. On the vertical charge transfer portions and the horizontal charge transfer portion, suitable transfer electrodes are provided for performing the transfer of the charges in the respective portions and a vertical transfer clock signal and a horizontal transfer clock signal are supplied thereto. The photo-sensing area produces a signal charge in response to the light received and stores the produced signal charges therein, and the signal charges are transferred to the vertical charge transfer portion through the transfer gate area and further transferred to the horizontal charge transfer portion during each period corresponding to a horizontal blanking period by the charge transfer operation of the vertical charge transfer portion. The signal charges transferred to the horizontal charge transfer portion during each one of the periods corresponding to the horizontal blanking periods is transferred to the output portion during a period corresponding to a horizontal video period and an image pickup signal output is obtained at the signal output terminal.

In the previously proposed interline transfer CCD image sensor, an undesirable potential difference is unavoidably induced between an area in the vertical charge transfer portion which is contiguous to the transfer gate area and the other area in the vertical charge transfer portion. This potential difference in the vertical charge transfer portion reduces the charge transfer efficiency in the vertical charge transfer portion and such a reduction of the charge transfer efficiency prevents miniaturization of the vertical charge transfer portions for increasing the sensitivity of the sensor and for miniaturizing the entire sensor and establishes a limitation on the design of the sensor. This is a disadvantage of previously proposed interline transfer CCD image sensors.

SUMMARY OF THE INVENTION

Accordingly, it is an object of the present invention to provide an improved solid state image sensor of the interline transfer type so as to avoid the defects and disadvantages inherent in the prior art.

Another object of the present invention is to provide an improved solid state image sensor of the interline transfer type which has a structure so that the charge transfer efficiency in the vertical charge transfer portion is increased over prior art devices.

A further object of the present invention is to provide an improved solid state image sensor, in which a transfer gate area is provided between a photo-sensing area and a vertical charge transfer portion for transferring signal charges produced and stored in the photo-sensing area to the vertical charge transfer portion and a channel stopper region contiguous to the transfer gate area is provided between the photo-sensing area and the vertical charge transfer portion and these regions are formed with the same impurity concentration and an improved arrangement of the transfer electrodes for performing the charge transfer in the transfer gate area and the vertical charge transfer portion is provided, so that undesirable potential differences in the vertical charge transfer portion which reduces charge transfer efficiency in the vertical charge transfer portion do not occur.

Other objects, advantages and features of the present invention will become apparent from the following description of a preferred embodiment taken in conjunction with the accompanying drawings.

DESCRIPTION OF THE PREFERRED EMBODIMENTS

Figure 1:
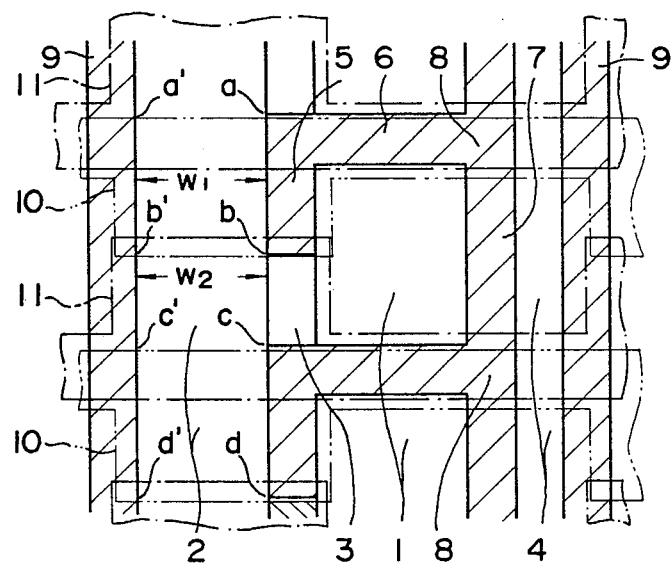
FIG. 1 is a partially enlarged plane view showing a portion of a prior art interline transfer CCD image sensor.

FIG. 1 illustrates a prior art device. In FIG. 1, sensing element regions in the sensing and vertical transfer portion of an interline transfer CCD image sensor are shown. The sensing element region contains a photo-sensing area 1, a vertical charge transfer portion 2, a transfer gate area 3 and an overflow drain 4 all formed on a common semiconductor substrate. A first channel stopper area 5 which is contiguous to the transfer gate area 3, a second channel stopper area 6 and a third channel stopper area 7 which is elongated in the vertical direction to form a overflow control gate area are formed between the photo-sensing area 1 and the vertical charge transfer portion 2, between two adjacent photo-sensing areas 1 and between the photo-sensing area 1 and the overflow drain 4, respectively. A portion 8 is formed at the position where the second and third channel stopper areas 6 and 7 cross each other. A fourth channel stopper area 9 which is elongated in the vertical direction is also provided along the overflow drain 4 on the side opposite to the third channel stopper area 7.

On the vertical charge transfer portion 2, vertical transfer electrodes are provided. The vertical transfer electrodes consist of a first transfer electrode 10 which is elongated in the horizontal direction and covers an area in the vertical charge transfer portion 2 which is contiguous to the first channel stopper area 5 and the first channel stopper area 5, and a second transfer electrode 11 which is elongated also in the horizontal direction covers an area in the vertical charge transfer portion 2 which is contiguous to the transfer gate area 3 and the transfer gate area 3. The second transfer electrode 11 is operative to be a transfer gate electrode. The first and second transfer electrodes 10 and 11 overlap each other on the second channel stopper area 6 and on the area which extends therefrom in the horizontal direction. The first and second transfer electrodes 10 and 11 are alternately placed on the vertical charge transfer portion 2 and are elongated in the vertical direction and a suitable vertical transfer clock signal is supplied to both the first and second transfer electrodes 10 and 11.

If the potential of the photo-sensing area 1, the potential of the vertical charge transfer portion 2, the potential of the transfer gate area 3, the potential of the first channel stop area 5, the potential of the third channel stop area 7 and the potential of the portion 8 are respectively expressed as $V_1$, $V_2$, $V_3$, $V_5$, $V_7$ and $V_8$, the following restrictions exist among these potentials.

During a light receiving period when the photo-sensing area 1 receives the light to produce and store the signal charge, the following inequalities should be satisfied:

1. In order to drain superfluous charges into the overflow drain 4 to suppress the undesirable phenomenon called "blooming";

$$V_1 > V_7 > V_3 \quad (1)$$

2. In order to perform the charge transfer in the vertical direction in the vertical charge transfer portion 2;

$$V_2 > V_3 \quad (2)$$

3. In order to separate the sensing element regions from each other;

$$V_7 > V_5, V_7 > V_8 \quad (3)$$

Also, during a gate transferring period when the signal charges stored in the photo-sensing area 1 are transferred to the vertical charge transfer portion 2 through the transfer gate area 3, the following inequalities should be satisfied:

4. In order to prevent the signal charge from flowing into the overflow drain 4;

$$V_2 > V_3 > V_7 \quad (4)$$

5. In order to separate the sensing element forming regions from each other;

$$V_3 > V_5, V_3 > V_8 \quad (5)$$

If the transfer gate area 3 and the portion 8 are formed with the same impurity concentration, when a gate transferring voltage is supplied to the second electrode 11 during the gate transferring period, the inequality (5) is not satisfied and the potential $V_3$ becomes equal to the potential $V_8$ and therefore a part of the signal charges flow into the overflow drain 4 through the portion 8. Thus, the transfer gate area 3 is formed with an impurity concentration which is different from the impurity concentration of portion 8 so that during the gate transferring period the potential $V_3$ of the transfer gate area 3 becomes higher (deeper wells) than the potential $V_8$ of portion 8. For example, in case the portion 8 is formed into a potential barrier forming a portion of a P-type impurity layer, the transfer gate area 3 is formed into a potential barrier forming portion of the surface barrier type. Thus, in case the transfer gate area 3 is formed with an impurity concentration which is different from the impurity concentration of portion 8 and also if the first and third channel stop areas 5 and 7, due to the restrictions of the above listed inequalities (4) and (5), the vertical charge transfer portion 2, the transfer gate area 3 and the first channel stop area 5 are formed with respective impurity concentrations which differ from each other, as a result, the boundary line between the vertical charge transfer portion 2 and the first channel stop area 5 (a–b or c–d in FIG. 1) will not coincide with the boundary lines between the vertical charge transfer portion 2 and the transfer gate area 3 (b–c in FIG. 1). Consequently, a difference between the width of a part of the vertical charge transfer portion 2 which is limited by the first channel stop area 5 ($w_1$ in FIG. 1) and the width of another part of the vertical charge transfer portion 2 which is limited by the transfer gate 3 ($w_2$ in FIG. 1) will exist and due to the narrow channel effect which results from this difference in width, a potential difference exists between an area of the vertical charge transfer portion 2 which is surrounded by the closed area a—a'—b'—b—a shown in FIG. 1 and another area of the vertical charge transfer portion 2 which is surrounded by the closed area b–b'—c—c'—b shown in FIG. 1.

Even if the boundary line a–b or c–d is made to coincide with the boundary line b–c by using means such as extremely fine masking techniques during the impurity diffusion process for producing the sensor, so that the width $w_1$ is made coincident with the width $w_2$, a potential difference will exist between the area surrounded by the lines a—a'—b'—b—a and the area surrounded by the lines b—b'—c'—c—b because of the difference in impurity concentration between the transfer gate area 3 and the first channel stopper area 5.

This is undesirable potential difference in the vertical charge transfer portion 2 reduces the charge transfer efficiency in the vertical charge transfer portion 2 and the reduced charge transfer efficiency in the vertical charge transfer portion 2 results in the defects and disadvantages of the previously proposed interline transfer CCD image sensors.

Accordingly, with the intent of avoiding the defects and disadvantages inherent in the prior art, in a solid state image sensor according to the present invention, both of transfer gate area and the channel stopper area contiguous to the transfer gate area are formed with the same impurity concentration between the photo-sensing area and the vertical charge transfer portion and also the vertical transfer electrode is improved in structure so that the relationships expressed by the above listed inequalities (1)–(5) are satisfied without undesirable potential differences existing in the vertical charge transfer portion.

Figure 2:
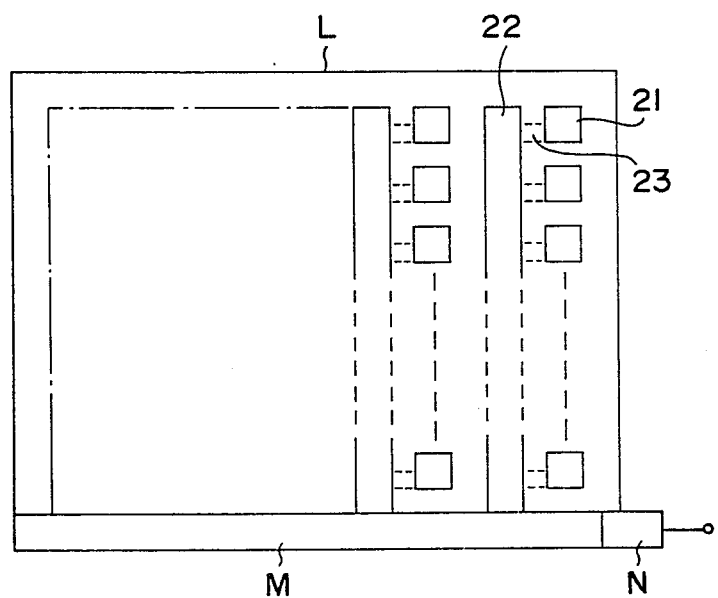
FIG. 2 is a schematic plane view showing one embodiment of solid state image sensor according to the present invention.
Figure 3:
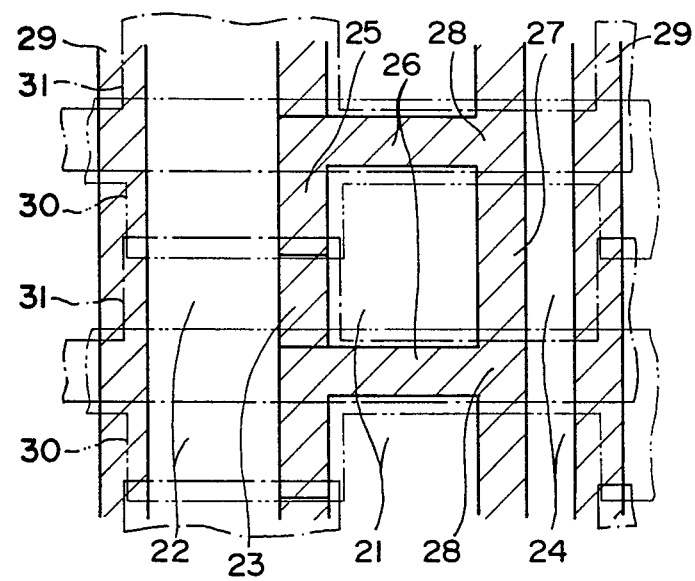
FIG. 3 is a partially enlarged plane view showing a portion of one embodiment of solid state image sensor according to the present invention.

An embodiment of a solid state image sensor of the interline transfer type according to the present invention is shown in FIGS. 2 and 3.

As shown in FIG. 2, the solid state image sensor of the interline transfer type according to the present invention comprises a sensing and vertical transfer portion L and includes a plurality of photo-sensing areas 21 arranged in horizontal rows and vertical columns. Vertical charge transfer portions 22 are provided along each of the vertical columns of the photo-sensing areas 21 and transfer gate areas 23 are provided between each of the photo-sensing areas 21 and the associated vertical charge transfer portion 22. A horizontal charge transfer portion M is coupled to the sensing and vertical transfer portion L and an output portion N is coupled to the horizontal charge transfer portion M, basically in a manner similar to the prior art devices. The solid state image sensor according to the present invention is characterized by the novel structure and operation of the sensing and vertical transfer portion L.

FIG. 3 shows a few sensing element regions which are provided in large numbers in the sensing and vertical transfer portion L of one example of the solid state image sensor according to the present invention. The sensing element region contains a photo-sensing area 21, a vertical charge transfer portion 22, a transfer gate area 23 and an overflow drain 24 each of which are formed on a common semiconductor substrate. The function of each of these areas and portions contained in the sensing element region is similar to the function of the corresponding areas and portions of the photo-sensing area 1, vertical charge transfer portion 2, transfer gate area 3 and overflow drain 4 contained in the sensing element region shown in FIG. 1.

The photo-sensing area 21 is surrounded by a first channel stopper area 25 which forms the transfer gate area 23 at a portion thereof and is located between the photo-sensing area 21 and the vertical charge transfer portion 22. A second channel stopper area 26 is provided between two adjacent photo-sensing area 1 and a third channel stopper area 27 forms an overflow control gate area between the photo-sensing area 21 and the overflow drain 24. The first, second and third channel stopper areas 25, 26 and 27 including the transfer gate area 23 are formed with the same impurity concentration. Accordingly, a portion 28 where the second and third channel stopper areas 26 and 27 cross each other has also the same impurity concentration as the transfer gate area 23. Further, a fourth channel stopper area 29 which is elongated in the vertical direction is provided along the overflow drain 24 on the side opposite to the third channel stopper area 27.

Vertical transfer electrodes for the charge transfer in the vertical direction in the vertical charge transfer portion 22 are also provided. The vertical transfer electrodes consist of a first transfer electrode 30 which is elongated in the horizontal direction to cover an area in the vertical charge transfer portion 22 where it is contiguous to the first channel stopper area 25. A second transfer electrode 31 is elongated also in the horizontal direction to cover an area in the vertical charge transfer portion 22 where it is contiguous to the transfer gate area 23. The second transfer electrode 31 operates concurrently as a transfer gate electrode, and the first and second transfer electrodes 30 and 31 overlap each other in the second channel stopper 26 and the areas which extend therefrom in the horizontal direction. In particular, on the second channel stopper area 26, the width of the first transfer electrode 30 is made to be wider than the width of the second transfer electrode 31 so that the second transfer electrode 31 is completely mounted on the first electrode 30 and, as a result it is shielded from the second channel stopper area 26 and the portion 28 by the first transfer electrode 30. The first and second transfer electrodes 30 and 31 are alternately positioned on the vertical charge transfer portion 22 and are elongated in the vertical direction and suitable vertical transfer clock signals are supplied to the first and second transfer electrodes 30 and 31. In addition, an overflow control gate electrode to which a suitable bias voltage is supplied is provided on the third channel stopper area 27.

The shape of each of the vertical transfer electrode 30 comprises a relative wide horizontal portion which extends over channel stopper 26 and a downwardly extending portion which extends down over a portion of the vertical charge transfer region, over channel stopper region 25 and to the transfer gate 23.

The electrode 31 is of the same general shape as electrode 30 but is vertically offset therefrom as shown. The portion of electrode 30 over region 26 is made wider than the electrode 31 as explained above.

In the same manner as in the prior art interline transfer CCD image sensor shown in FIG. 1, if the potential of the photo-sensing area 21, the potential of the vertical charge transfer portion 22, the potential of the transfer gate area 23, the potential of the first channel stopper area 25, the potential of the third channel stopper area 27 and the potential of the portion 28 are defined as $V_{21}$, $V_{22}$, $V_{23}$, $V_{25}$, $V_{27}$, and $V_{28}$, respectively, the below mentioned restrictions are imposed upon the relationship among these potentials.

That is, during a light receiving period when the photo-sensing area 21 receives light to produce and store signal charges, the following inequalities should be satisfied;

$$V_{21} > V_{27} > V_{23} \tag{1'}$$

$$V_{22} > V_{23} \tag{2'}$$

$$V_{27} > V_{25}, \ V_{27} > V_{28} \tag{3'}$$

During a gate transfer period when the signal charges stored in the photo-sensing area 21 are transferred to the vertical charge transfer portion 22 through the transfer gate area 23, $$V_{22} > V_{23} > V_{27} \tag{4'}$$

$$V_{23} > V_{25}, \ V_{23} > V_{28} \tag{5'}$$

In the embodiment shown in FIG. 3, since the second transfer electrode 31 is shielded by the first transfer electrode 30 from the second channel stopper area 26 and the portion 28, the electric field produced by the voltage supplied to the second transfer electrode 31 does not affect or affects very little the second channel stopper area 26 and the portion 28. Accordingly, although the transfer gate area 23 and the portion 28 have the same impurity concentration when a gate transferring voltage is supplied to the second electrode 31 during the gate transfer period, the potential of the transfer gate area 23 and the potential of the portion 28 can be independently determined so as to satisfy the relationship among the potentials $V_{21}$, $V_{23}$, $V_{25}$, $V_{27}$ and $V_{28}$ as expressed by the above listed inequalities (1')–(5').

However, in this case, it is necessary for the first and second transfer electrodes 30 and 31 to be supplied with different voltages, respectively, during the gate transferring period. Although there is no problem for the case where the vertical transfer clock signal is a four-phase signal, in the case where the vertical transfer clock signal is a two-phase signal, it is necessary to supply a common vertical transfer clock signal to both the first and second transfer electrodes 30 and 31 during the vertically transferring period when the signal charges which have been transferred to the vertical charge transfer portion 22 are transferred to the horizontal charge transfer portion M, and to supply different vertical transfer clock signals to the first and second transfer electrodes 30 and 31, respectively, during the gate transferring period.

Figure 4A:
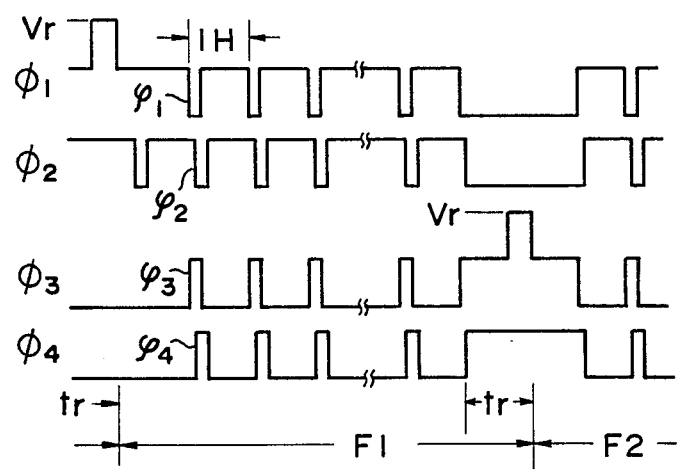
FIGS. 4A and 4B are schematic illustrations showing wave forms of examples of vertical transfer clock signals supplied to the embodiment shown in FIG. 3.
Figure 4B:
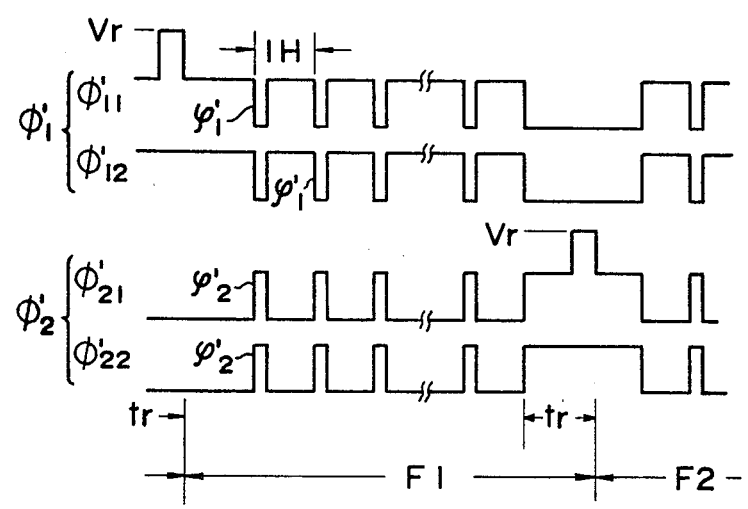

FIGS. 4A and 4B show a couple of examples of the vertical transfer clock signals which are supplied to the solid state image sensor according to the present invention which have the sensing element regions shown in FIG. 3. In FIG. 4A, an example of a four-phase clock signal as the vertical transfer clock signal is shown. The four-phase clock signal shown in FIG. 4A includes four clock signals $\phi_1$, $\phi_2$, $\phi_3$ and $\phi_4$, which are supplied to each electrode of two contiguous pairs of first and second electrodes 30 and 31, respectively. The clock signals $\phi_1$, $\phi_2$, $\phi_3$ and $\phi_4$ contain a plurality of clock pulses $\phi_1$, $\phi_2$, $\phi_3$ and $\phi_4$ each appearing at every period corresponding to the line period and each having different phases, respectively. Further, the clock signal $\phi_1$ provides a gate transferring voltage $V_r$ during the gate transferring period $t_r$ in each period $F_1$ which corresponds to the odd field period, and the clock signal $\phi_3$ provides the gate transferring voltage $V_r$ during each period $F_2$ which corresponds to the even field period.

In FIG. 4B, an example of two-phase clock signal as the vertical transfer clock signal is shown. The two-phase clock signal shown in FIG. 4B includes a clock signal $\phi'_1$ which is composed of a pair of signals $\phi'_{11}$ and $\phi'_{12}$ and a clock signal $\phi'_2$ which is composed of a pair of signals $\phi'_{21}$ and $\phi'_{22}$. The signals $\phi'_{11}$, $\phi'_{12}$, $\phi'_{21}$ and $\phi'_{22}$ are supplied to each electrode of two contiguous pairs of first and second transfer electrodes 30 and 31, respectively. Both of the signals $\phi'_{11}$ and $\phi'_{12}$ contain a plurality of clock pulses $\phi'_1$ which appear every period corresponding to the line period and both of the signals $\phi'_{21}$ and $\phi'_{22}$ contain a plurality of clock pulses $\phi'_2$, with phases which are opposite to phases of the clock pulses $\phi'_1$, and which appear every period corresponding to the line period. The signal $\phi'_{11}$ provides the gate transferring voltage $V_r$ during the gate transferring period $t_r$ during each period $F_1$ corresponding to the odd field period, and the signal $\phi'_{21}$ provides the gate transferring voltage $V_r$ during the gate transferring period $t_r$ during each period $F_2$ corresponding to the even field period. With the application of the four-phase clock signal including the four clock signals $\phi_1$, $\phi_2$, $\phi_3$ and $\phi_4$ or the two-phase clock signal including the two clock signals $\phi_1$ and $\phi_2$ to the first and second transfer electrodes 30 and 31 which form the vertical transfer electrodes in the above mentioned manner, proper charge transfer occurs. Also, the first and second transfer electrodes 30 and 31 on the sensing element regions wherein the charge transfer by the transfer gate area 23 is to be performed are given different voltages, respectively, during the gate transferring period, so that the signal charges stored in the photo-sensing area 21 are transferred to the vertical charge transfer portion 22 through the transfer gate area 23. Then the signal charges in the vertical charge transfer portion 22 are further transferred to the horizontal charge transfer portion M.

As apparent from the above explanation of the inventive embodiment, in the solid state image sensor of the interline transfer type according to the present invention, since both the transfer gate area and the channel stopper area contiguous to the transfer gate area positioned between the photo-sensing area and the vertical charge transfer portion are formed with the same impurity concentration there need be no difference in the width between a part contiguous to the transfer gate area and another part contiguous to the channel stopper area in the vertical charge transfer portion, and therefore no undesirable potential differences are induced therebetween during the period of the charge transfer in the vertical charge transfer portion. Consequently, the charge transfer efficiency in the vertical charge transfer portion is greatly improved and as a result it is possible to minimize the width of the vertical charge transfer portion so that the solid state image sensor according to the present invention can be made very small and the entire unit can be miniaturized. Further, the resolution of the image of the solid state image sensor according to the present invention is improved by allowing an increase in the number of the sensing element regions. Also, the sensitivity of the sensor is increased.

Although the invention has been described with respect to preferred embodiments, it is not to be so limited as changes and modifications can be made which are within the full intended scope of the invention as defined by the appended claims.

I claim as my invention:

1. A solid state image sensor comprising: a sensing and vertical transfer portion having a large number of sensing element regions each of said sensing element regions containing a photo-sensing area for producing and storing signal charges, a vertical charge transfer portion for vertically transferring the signal charges, a transfer gate area for transferring the signal charges to said vertical charge transfer portion from said photo-sensing area and a channel stopper area provided which surrounds said photo-sensing area and forms said transfer gate area at a portion thereof, a horizontal charge transfer portion provided at one end of said sensing and vertical transfer portion for transferring horizontally the signal charges which have been transferred from said sensing and vertical transfer portion, a first transfer electrode extending over a first part of said vertical charge transfer portion and a part of said channel stopper area and located between two adjacent said photo-sensing areas, and a second transfer electrode extending over a second part of said vertical charge transfer portion, said transfer gate area and said part of the channel stopper area, said second transfer electrode being placed over said first transfer electrode at the position of said part of said channel stopper area so that it is shielded from said part of said channel stop area by said first transfer electrode, and wherein said first transfer electrode has a greater dimension in the direction between adjacent sensing areas than the dimension of said second transfer electrode in the region of said part of said channel stopper in the direction between adjacent sensing areas.

2. A solid state image sensor of the interline transfer type comprising a sensing portion for a matrix of photo sensing areas formed of semiconductor regions in a substrate, channel stopper regions surrounding each of said sensing areas on all sides except that in one side an open transfer gate portion is left open, a charge transfer region adjacent the transfer gate portions of a number of said sensing area to transfer the charges therefrom, a first transfer electrode formed on said substrate and extending over a first portion of said channel stopper which is between adjacent photo-sensing areas and over a portion of said charge transfer region but not over said open transfer gate portion, a second transfer electrode formed on said substrate and extending over said first portion of said channel stopper and over a portion of said charge transfer region and over said open transfer gate portion and a first portion of said first transfer electrode which extends over said first portion of said channel stopper shielding the first portion of said channel stopper from a first portion of the second transfer electrode which extends over said first portion of said channel stopper, and wherein said first portion of said first transfer electrode has a greater dimension in the direction between adjacent sensing areas than the dimension of said second transfer electrode in the direction between adjacent sensing areas.

3. A solid state image sensor according to claim 2 wherein said first portion of said first transfer electrode is under said first portion of said second transfer electrode.

* * * * *